(12) United States Patent
Li et al.

(10) Patent No.: US 8,482,012 B2
(45) Date of Patent: Jul. 9, 2013

(54) CHIP MODULE PACKAGE STRUCTURE

(75) Inventors: Kuo-Hsiung Li, Hsinchu (TW); Hung-Ching Lai, Hsinchu (TW)

(73) Assignee: Pixart Imaging Inc., Hsinchu (TW)

( * ) Notice: Subject to any disclaimer, the term of this patent is extended or adjusted under 35 U.S.C. 154(b) by 203 days.

(21) Appl. No.: 12/834,348

(22) Filed: Jul. 12, 2010

(65) Prior Publication Data

US 2011/0200066 A1 Aug. 18, 2011

(30) Foreign Application Priority Data

Feb. 12, 2010 (TW) ................................ 99203302 U

(51) Int. Cl.
*H01L 27/15* (2006.01)
*H01L 29/16* (2006.01)
*H01L 31/12* (2006.01)
*H01L 33/00* (2010.01)

(52) U.S. Cl.
USPC ...... 257/82; 257/433; 257/434; 257/E33.058; 257/E33.076; 257/E31.127; 250/239

(58) Field of Classification Search
None
See application file for complete search history.

(56) References Cited

U.S. PATENT DOCUMENTS

| | | | | |
|---|---|---|---|---|
| 2011/0057203 A1* | 3/2011 | Cheng et al. | .................... | 257/81 |
| 2011/0133941 A1* | 6/2011 | Yao et al. | ...................... | 340/600 |
| 2011/0186736 A1* | 8/2011 | Yao et al. | ................... | 250/338.4 |

* cited by examiner

*Primary Examiner* — Benjamin Sandvik
*Assistant Examiner* — Leslie Pilar Cruz
(74) *Attorney, Agent, or Firm* — Morris Manning & Martin LLP; Tim Tingkang Xia, Esq.

(57) ABSTRACT

A chip module package structure applied to an optical input device includes a cover body, a first chip module, and a second chip module. The first chip module and the second chip module are respectively combined with the cover body, the first chip module has an optical source, and the second chip module has an optical sensor. Further, the optical source and the optical sensor form a preset relative spatial position relation, such that a part of light emitted by the optical source is received by the optical sensor after at least one reflection.

9 Claims, 2 Drawing Sheets

CHIP MODULE PACKAGE STRUCTURE

CROSS-REFERENCE TO RELATED APPLICATIONS

This non-provisional application claims priority under 35 U.S.C. §119(a) on Patent Application No(s). 099203302 filed in Taiwan, R.O.C. on Feb. 12, 2010, the entire contents of which are hereby incorporated by reference.

BACKGROUND OF THE INVENTION

1. Field of the Invention

The present invention relates to a package structure, and more particularly to a chip module package structure.

2. Related Art

With the rapid development and advancement of the electronic industry, various electronic products have been widely applied in daily lives, and provide more diversified functional options for users. The functional options of the electronic products usually need to be achieved by peripheral input devices (for example, a mouse, a keyboard, and a remote controller) of the electronic products.

For example, in a computer system, instructions are usually input and operated by using a mouse device. Generally, mice can be approximately categorized into two types, namely, mechanical and optical mice. A mechanical mouse mainly utilizes rotation of a trackball disposed at a bottom thereof to drive a sensing element in the mouse, so as to calculate a moving distance of the mouse. However, during rotation, the trackball is easily abraded due to an operation plane (for example, a table top or mouse pad) on which the mouse is placed, and easily carries impurities such as dust and cotton flock on the operation plane into the mouse, resulting in that the accuracy of the mechanical mouse is easily degraded after a long time of use.

An optical mouse is based on optics principles, in which an optical source irradiates a surface, a beam reflected back is picked up within a certain period of time, and by means of rapid scan and pickup, a moving direction and a moving distance of the optical mouse are calculated through comparison. The optical mouse replaces the trackball with the optical technique, so as to solve the problem that the trackball of the mechanical mouse is easily abraded and impurities easily accumulate in the mechanical mouse. Generally, in terms of structural configuration, the optical mouse mainly includes an upper housing and a lower housing, and a lens assembly and a circuit board are disposed in an accommodation space formed by the upper housing and the lower housing. The lens assembly is disposed on the lower housing, a light emitting diode (LED) and a sensor are inserted on the circuit board, and bottom sides of the LED and the sensor are corresponding to the lens assembly. In use, a light ray signal emitted by the LED emits passes through a first lens of the lens assembly, and is refracted to a surface (for example, a table top) by a reflecting mirror, reflected to a second lens of the lens assembly by the surface, and then received by the sensor.

However, in the main structure of the conventional optical mouse, since the LED and the sensor need to be respectively disposed on the circuit board, and relative positions of the LED and the sensor need to be accurately adjusted accordingly, the assembly time required for the conventional optical mouse is rather long, resulting in an excessive manufacturing and production cost.

SUMMARY OF THE INVENTION

In view of the above problems, the present invention is a chip module package structure, which can solve the problem that during the manufacturing and assembly of a conventional optical mouse, since an LED and a sensor need to be respectively disposed on a circuit board, and positions of the LED and the sensor need to be adjusted, the assembly time required for the conventional optical mouse is rather long, thereby affecting the production efficiency of an optical input device.

The present invention provides a chip module package structure, which comprises a cover body, a first chip module, and a second chip module. The cover body has a first combining region and a second combining region. The first chip module is combined with the first combining region of the cover body, and has a first accommodation space and an optical source on one side of the first chip module opposite to the cover body, in which the optical source is disposed in the first accommodation space. The second chip module is combined with the second combining region of the cover body, and has a second accommodation space and an optical sensor on one side of the second chip module opposite to the cover body, in which the optical sensor is disposed in the second accommodation space. When the first chip module and the second chip module are combined with the cover body, the optical source of the first chip module and the optical sensor of the second chip module perform a preset relative spatial position relation, such that a part of light emitted by the optical source is received by the optical sensor after at least one reflection.

In the chip module package structure according to the present invention, a first chip module and a second chip module are integrated on a cover body. When the chip module package structure is disposed in the optical input device, the first chip module and the second chip module can be disposed at the same time in a single operation process, thereby saving the time required for assembling the chip module package structure into the optical input device. Meanwhile, the first chip module and the second chip module are respectively combined with the cover body, such that when one of the first chip module and the second chip module is damaged, only the damaged first chip module or the damaged second chip module needs to be replaced, instead of replacing the whole chip module package structure, thereby effectively saving the manufacturing and production cost of the chip module package structure.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
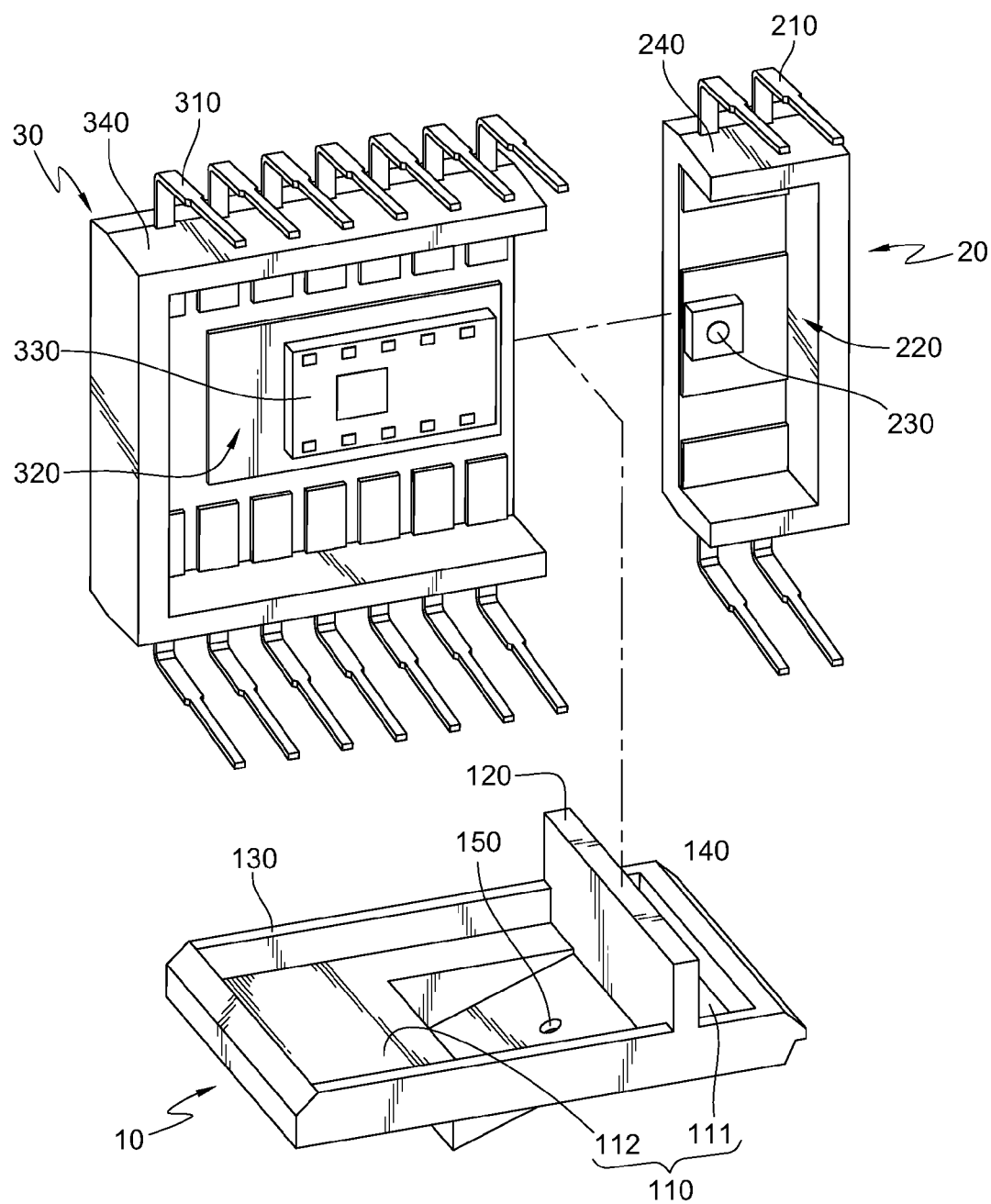
FIG. 1 is a schematic exploded view of an embodiment of the present invention.
Figure 2:
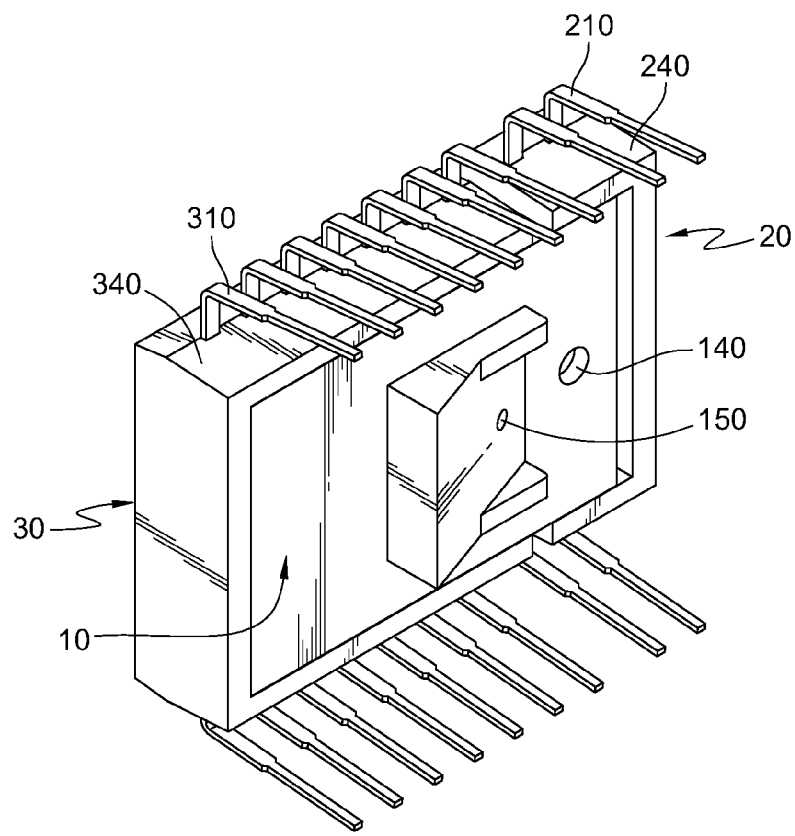
FIG. 2 is a schematic assembled view of an embodiment of the present invention.
Figure 3:
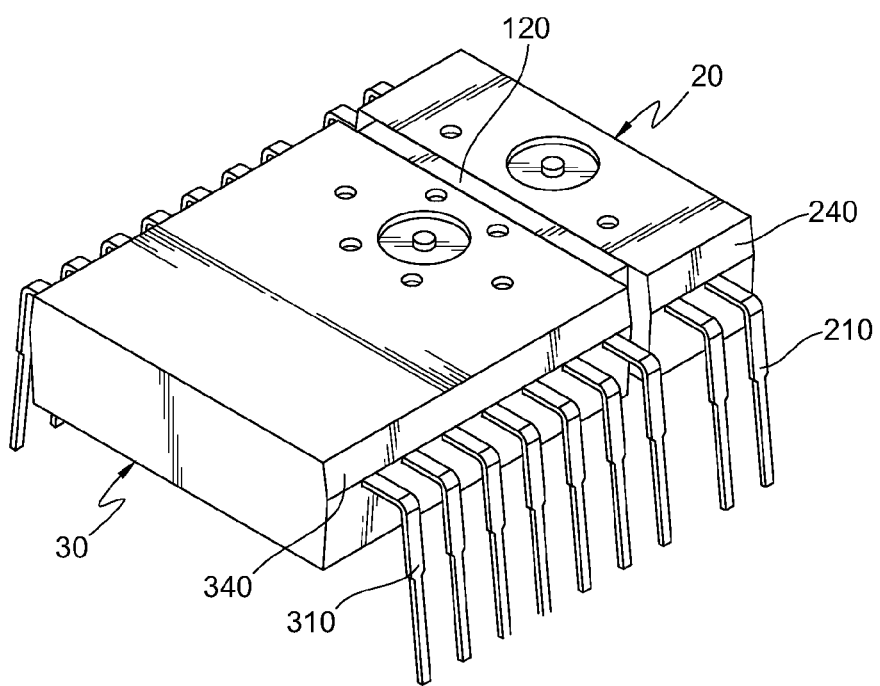
FIG. 3 is a schematic assembled view of an embodiment of the present invention from another angle of view.

Referring to FIGS. 1 to 3, a chip module package structure according to an embodiment of the present invention is applied to an optical input device (for example, an optical mouse), and the chip module package structure comprises a cover body 10, a first chip module 20, and a second chip module 30. The cover body 10 has a combining surface 110, a partitioning structure 120, a side wall 130, a first perforation 140, and a second perforation 150. The combining surface 110 has a first combining region 111 and a second combining region 112, the partitioning structure 120 is disposed on the combining surface 110 and stands between the first combining region 111 and the second combining region 112, and the side wall 40 surrounds a periphery of the combining surface 120. The first perforation 140 and the second perforation 150 are respectively disposed in the first combining region 111 and the second combining region 112 of the combining surface 110, and the first perforation 140 and the second perforation 150 respectively penetrate the first combining region 111 and the second combining region 112.

The first chip module 20 is a light emitting chip module, and has a plurality of electrical pins 210, a first accommodation space 220, and an optical source 230. The plurality of electrical pins 210 is respectively disposed on two opposite outer side surfaces 240 of the first chip module 20 and is connected to the optical source 230, so as to provide electrical conduction between the optical source 230 and external circuit elements. The first accommodation space 220 is disposed between the two outer side surfaces 240, and the first accommodation space 220 is corresponding to the first combining region 111 of the combining surface 110. The optical source 230 is electrically disposed in the first accommodation space 220, and may be an infrared ray, a laser diode (LD), an LED, or a vertical cavity surface emitting laser (VCSEL). Although not shown, the optical source 230 and the plurality of electrical pins 210 are electrically conducted.

The second chip module 30 is an optical sensing chip module, and has a plurality of electrical pins 310, a second accommodation space 320, and an optical sensor 330. The plurality of electrical pins 310 is respectively disposed on two opposite outer side surfaces 340 of the second chip module 30 and is connected to the optical sensor 330, so as to provide electrical conduction between the optical source 330 and external circuit elements, and the plurality of electrical pins 310 is also electrically conducted to the optical sensor 330 (not shown). The second accommodation space 320 is disposed between the two outer side surfaces 340, and the second accommodation space 320 is corresponding to the second combining region 112 of the combining surface 110. The optical source 330 is electrically disposed in the second accommodation space 320.

The first chip module 20 and the second chip module 30 are respectively detachable combined with the first combining region 111 and the second combining region 112 of the combining surface 110, and are respectively located on two ends of the cover body 10 as being partitioned by the partitioning structure 120. Such that, the first chip module 20 and the second chip module 30 may be configured to be individually mounted on or removed from the cover body 10. Besides, the function of partitioning the first combining region 111 and the second combining region 112, the partitioning structure 120 is also used to block unnecessary light rays from leaking from the first chip module 20 to the second chip module 30. A length and a width of the first combining region 111 of the combining surface 110 respectively match a length and a width of the first accommodation space 220, and a length and a width of the second combining region 112 respectively match a length and a width of the second accommodation space 320. Therefore, when the first chip module 20 and the second chip module 30 are respectively combined with the first combining region 111 and the second combining region 112, the first accommodation space 220 of the first chip module 20 and the second accommodation space 320 of the second chip module 30 are respectively sleeved on the first combining region 111 and the second combining region 112. Further, the side wall 130 on the combining surface 110 is embedded in the first accommodation space 220 and the second accommodation space 320, such that the first chip module 20 and the second chip module 30 are pressed against the cover body 10 by the side wall 130. In addition to being a partitioning structure, the partitioning structure 120 may be other structures having a partitioning function and capable of blocking unnecessary light rays, for example, the partitioning structure 120 may be two partitioning structures, respectively corresponding to the first accommodation space 220 and the second accommodation space 320.

Afterward, the first chip module 20 and the second chip module 30 are stably disposed on the cover body 10 in a dispensing manner or other combining manners, or a hook and a recess (not shown) matching each other are disposed between the side wall 130 and the first chip module 20 and between the side wall 130 and the second chip module 30, such that the first chip module 20 and the second chip module 30 are combined with the cover body 10 in a buckling manner. The above combining manners are illustrated by way of example only, but not intended to limit the present invention.

Referring to FIGS. 1 to 3, after the first chip module 20 and the second chip module 30 are combined with the cover body 10, the optical source 230 of the first chip module 20 is corresponding to the first perforation 140 of the cover body 10, the optical sensor 330 of the second chip module 30 is corresponding to the second perforation 150 of the cover body 10, and the optical source 230 and the optical sensor 330 are blocked by the partitioning structure 120, and thus are isolated in the first accommodation space 220 and the second accommodation space 320.

In an application of the chip module package structure according to an embodiment of the present invention, the chip module package structure is disposed on a circuit board (not shown) of the optical input device, the chip module package structure is inserted to the circuit board through the electrical pins 210 of the first chip module 20 and the electrical pins 310 of the second chip module 30, and is electrically conducted to the circuit board. When the optical source 230 of the first chip module 20 emits a light ray, since the optical source 230 and the optical sensor 330 are blocked by the partitioning structure 120, the light ray can only pass through the first perforation 140, and then the light ray is reflected by a reflecting surface to enter the second accommodation space 320 through the second perforation 150, and is received by the optical sensor 330.

In the chip module package structure according to the present invention, the first chip module and the second chip module are combined with the same cover body. When the chip module package structure is disposed on the optical input device, the procedure of disposing the chip module package structure can be simplified and the assembly time required for the chip module package structure can be saved. Meanwhile, the first chip module and the second chip module are respectively combined with the cover body, such that when one of the first chip module and the second chip module is damaged, only the damaged first chip module or the damaged second chip module needs to replaced, so as to prevent the discarding of the whole chip module package structure due to the damage of one of the first chip module and the second chip module, thereby saving the manufacturing and production cost of the chip module package structure.

What is claimed is:

1. A chip module package structure, applied to an optical input device, the chip module package structure comprising:
   a cover body, having a first combining region and a second combining region;
   a first chip module, combined with the first combining region, and having a first accommodation space and an optical source, wherein the optical source is disposed in the first accommodation space and faces to the cover body; and a second chip module, combined with the second combining region, and having a second accommodation space and an optical sensor, wherein the optical sensor is disposed in the second accommodation space and faces to the cover body;

wherein the first chip module and the second chip module are respectively detachable combined with the cover body, the first chip module and the second chip module are configured to be individually mounted on or individually removed from the cover body, when the first chip module and the second chip module are combined with the cover body, the optical source and the optical sensor perform a preset relative spatial position relation, such that a part of light emitted by the optical source is received by the optical sensor after at least one reflection.

2. The chip module package structure according to claim 1, wherein the cover body further has at least one partitioning structure, disposed between the first combining region and the second combining region, for isolating the first chip module from the second chip module on the cover body.

3. The chip module package structure according to claim 2, wherein the cover body further has a side wall, surrounding the cover body.

4. The chip module package structure according to claim 2, wherein the cover body further has a first perforation and a second perforation, respectively disposed in the first combining region and the second combining region, and respectively corresponding to the optical source and the optical sensor.

5. The chip module package structure according to claim 1, wherein the cover body further has a side wall, surrounding the cover body.

6. The chip module package structure according to claim 1, wherein the first chip module and the second chip module respectively have a plurality of electrical pins, the electrical pins of the first chip module are connected to the optical source, and the electrical pins of the second chip module are connected to the optical sensor.

7. The chip module package structure according to claim 1, wherein the cover body further has a first perforation and a second perforation, respectively disposed in the first combining region and the second combining region, and respectively corresponding to the optical source and the optical sensor.

8. The chip module package structure according to claim 1, wherein the optical source is selected from the group consisting of an infrared ray, a laser diode (LD), a light emitting diode (LED), and a vertical cavity surface emitting laser (VCSEL).

9. The chip module package structure according to claim 1, wherein the first chip module and the second chip module are combined with the cover body in a dispensing manner or a buckling manner.

* * * * *